United States Patent
Strong et al.

(10) Patent No.: US 10,884,450 B2
(45) Date of Patent: Jan. 5, 2021

(54) CLOCK DISTRIBUTION SYSTEM

(71) Applicants: Joshua A. Strong, Ellicott City, MD (US); Max E. Nielsen, Odenton, MD (US)

(72) Inventors: Joshua A. Strong, Ellicott City, MD (US); Max E. Nielsen, Odenton, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 491 days.

(21) Appl. No.: 15/913,471

(22) Filed: Mar. 6, 2018

(65) Prior Publication Data

US 2019/0278321 A1 Sep. 12, 2019

(51) Int. Cl.
| | |
|---|---|
| *G06F 1/10* | (2006.01) |
| *H01P 7/08* | (2006.01) |
| *H03K 5/15* | (2006.01) |
| *H01L 23/66* | (2006.01) |

(52) U.S. Cl.
CPC ............... *G06F 1/10* (2013.01); *H01L 23/66* (2013.01); *H01P 7/082* (2013.01); *H03K 5/15013* (2013.01)

(58) Field of Classification Search
CPC .. G06F 1/10; H01J 25/72; H01P 7/082; H01L 23/66; H03K 5/15013
See application file for complete search history.

(56) References Cited

U.S. PATENT DOCUMENTS

| | | | |
|---|---|---|---|
| 5,387,885 A | * | 2/1995 | Chi ........................... H01P 5/12 326/93 |
| 5,990,721 A | | 12/1999 | Mellitz |
| 6,098,176 A | | 8/2000 | Coteus et al. |
| 6,184,736 B1 | | 2/2001 | Wissell et al. |
| 6,229,861 B1 | | 5/2001 | Young |

(Continued)

FOREIGN PATENT DOCUMENTS

| | | |
|---|---|---|
| JP | H0854957 A | 2/1996 |
| WO | 20160209387 A1 | 12/2016 |

OTHER PUBLICATIONS

European Examination Report corresponding to EP Patent Application No. 16 726 447.2-1206 dated Apr. 25, 2019.

(Continued)

*Primary Examiner* — Dinh T Le
(74) *Attorney, Agent, or Firm* — Tarolli, Sundheim, Covell & Tummino LLP (57) ABSTRACT

One embodiment includes a clock distribution system. The system includes at least one resonator spine that propagates a clock signal and at least one resonator rib conductively coupled to the at least one resonator spine and being arranged as a standing wave resonator. At least one of the at least one resonator rib has a thickness that varies along a length of the respective one of the at least one resonator rib. The system also includes at least one transformer-coupling line. Each of the at least one transformer-coupling line can be conductively coupled to an associated circuit and being inductively coupled to the at least one resonator rib to inductively generate a clock current corresponding to the clock signal to provide functions for the associated circuit.

20 Claims, 5 Drawing Sheets

(56) References Cited

U.S. PATENT DOCUMENTS

| | | | |
|---|---|---|---|
| 6,563,358 B1* | 5/2003 | Goulette | G06F 1/10 327/291 |
| 7,145,408 B2 | 12/2006 | Shepard et al. | |
| 8,525,569 B2 | 9/2013 | Bucelot et al. | |
| 9,509,490 B1 | 11/2016 | Dabral | |
| 9,722,589 B1 | 8/2017 | Talanov et al. | |
| 9,831,866 B2* | 11/2017 | Ma | H04B 1/38 |
| 9,939,841 B1* | 4/2018 | Dusatko | H03H 11/28 |
| 10,133,299 B1 | 11/2018 | Strong et al. | |
| 10,331,163 B1 | 6/2019 | Luo | |
| 10,431,867 B1 | 10/2019 | Strong et al. | |
| 10,474,183 B2 | 11/2019 | Strong et al. | |
| 10,520,974 B2 | 12/2019 | Strong et al. | |
| 10,591,952 B1 | 3/2020 | Strong et al. | |
| 2007/0285179 A1 | 12/2007 | Ikeda et al. | |
| 2009/0146748 A1 | 6/2009 | Pernia et al. | |
| 2016/0125309 A1 | 5/2016 | Naaman et al. | |
| 2016/0370822 A1 | 12/2016 | Strong et al. | |
| 2019/0278321 A1 | 9/2019 | Strong et al. | |

OTHER PUBLICATIONS

Chi V L: "Salphasic Distribution of Clock Signals for Synchrc" IEEE Transactions on Computers, IEEE Service Center, Los Al vol. 43, No. 5, May 31, 1994 (May 31, 1994 ), pp. 597-602, XP000442053, ISSN: 0018-9340, DOI: 10.1109/12.280806.

Japanese Office Action corresponding to Japanese Patent Application No. 2017-0562039, dated Dec. 25, 2018.

Herr, Q. et al: "Ultra-Low-Power 1-20 Superconductor Logic," arxiv.org, Cornell University Library, 201 Olin Library Cornell University Ithaca, NY 14853, Mar. 22, 2011 (Mar. 22, 2011) the whole document.

International Search Report corresponding to International Application No. PCT/US2019/018396 dated Apr. 25, 2019.

Chi V L. "Salphasic Distribution of Clock Signals for Synchronous Systems", IEEE Transactions on Computers, IEEE Service Center, vol. 43, No. 5, Mar. 1, 1994.

Korean Office Action for Application Serial No. 10-2017-7037126 dated May 29, 2019.

Korean Office Action for Application No. 10-2017-7037126 dated Dec. 23, 2019.

Non Final Office Action for U.S. Appl. No. 16/352,558, dated Sep. 24, 2019.

International Search Report for International Application No. PCT/US2020/017701 dated May 28, 2020.

International Written Opinion and Search Report corresponding to International Application No. PCT/US2018/058243 dated Jan. 30, 2019.

Non Final Office Action for U.S. Appl. No. 16/682,860 dated Mar. 20, 2020.

* cited by examiner

CLOCK DISTRIBUTION SYSTEM

GOVERNMENT INTEREST

The invention was made under Government Contract Number W911NF-14-C-0116. Therefore, the US Government has rights to the invention as specified in that contract.

TECHNICAL FIELD

The present invention relates generally to computer systems, and specifically to a clock distribution system.

BACKGROUND

Typical circuits that implement logic functions can operate based on a clock to synchronize data and/or provide a time-based flow of the logic functions. Circuits that are based on complementary metal-oxide-semiconductor (CMOS) technology can implement a clock to indicate when a given logic circuit or gate is to capture data at one or more inputs for processing or transferring the data to other logic functions. A given clock can thus provide a clock signal to a variety of devices in the circuit to provide the requisite timing information, and thus to substantially synchronize data transfer and timing functions. Other types of circuits can implement clock signals, such as reciprocal quantum logic (RQL) circuits. RQL circuits can implement timing information based on a clock that is provided, for example, as a signal having a substantially stable-frequency.

SUMMARY

One example includes a clock distribution system. The system includes at least one resonator spine that propagates a clock signal and at least one resonator rib conductively coupled to the at least one resonator spine and being arranged as a standing wave resonator. At least one of the at least one resonator rib has a thickness that varies along a length of the respective one of the at least one resonator rib. The system also includes at least one transformer-coupling line. Each of the at least one transformer-coupling line can be conductively coupled to an associated circuit and being inductively coupled to the at least one resonator rib to inductively generate a clock current corresponding to the clock signal to provide functions for the associated circuit.

Another example includes a clock distribution system. The system includes at least one resonator spine that propagates a clock signal and at least one resonator rib conductively coupled to the at least one resonator spine and being arranged as a standing wave resonator. At least one of the at least one resonator rib has a thickness that varies in a tapered manner along a length of the respective one of the at least one resonator rib. The system further also includes at least one transformer-coupling line. Each of the at least one transformer-coupling line can be conductively coupled to an associated circuit and being inductively coupled to the at least one resonator rib to inductively generate a clock current corresponding to the clock signal to provide functions for the associated circuit.

Another example includes a clock distribution system. The system includes at least one resonator spine that propagates a clock signal and at least one resonator rib conductively coupled to the at least one resonator spine and being arranged as a standing wave resonator. At least one of the at least one resonator rib has a thickness that varies in a step-wise manner along a length of the respective one of the at least one resonator rib. The system also includes at least one transformer-coupling line. Each of the at least one transformer-coupling line can be conductively coupled to an associated circuit and being inductively coupled to the at least one resonator rib to inductively generate a clock current corresponding to the clock signal to provide functions for the associated circuit.

DETAILED DESCRIPTION

The present invention relates generally to computer systems, and specifically to a clock distribution system. The clock distribution system, as described herein, is arranged as a resonator "spine" and "rib" configuration. As described herein, the term "spine", as pertaining to the resonator, describes a conductor that is configured to propagate a clock signal (e.g., a sinusoidal clock signal). The term "rib", as pertaining to the resonator, describes a conductor that is conductively coupled to the spine and is arranged as a standing-wave resonator that propagates the clock signal. The clock distribution system can include a plurality of resonator ribs that are each conductively coupled to the same resonator spine, and thus can each separately propagate the clock signal from the resonator spine.

In addition, the clock distribution system includes at least one transformer-coupling line that is conductively coupled to an associated circuit. The transformer-coupling line(s) are inductively coupled to the resonator rib(s) via a plurality of inductive couplings to inductively generate a clock current corresponding to the clock signal to provide functions for the associated circuit. As described herein, there a multitude of different configurations of the resonator rib and spine, and thus a multitude of different ways to provide the inductive couplings of the transformer-coupling line(s) to the resonator rib(s).

Each of the resonator rib(s) can have a thickness that varies along the length of the respective resonator rib. As described herein, the term "thickness", as pertaining to the resonator rib(s) describes at least one dimension (e.g., width) of a cross-section of the respective resonator rib. Because the inductive coupling of the transformer coupling line(s) and the resonator rib(s) can be based on the thickness of the respective resonator rib(s) at a given portion of the respective resonator rib(s), the inductive coupling of the transformer coupling line(s) and the resonator rib(s) can be controlled based on the relative thickness of the resonator rib(s). Accordingly, the variation of the thickness of the resonator rib(s) along the length of the of the respective resonator rib(s) can provide a manner that affects amplitude of the induced clock current in a given transformer-coupling line relative to a different transformer-coupling line inductively coupled to the same resonator rib(s).

Figure 1:
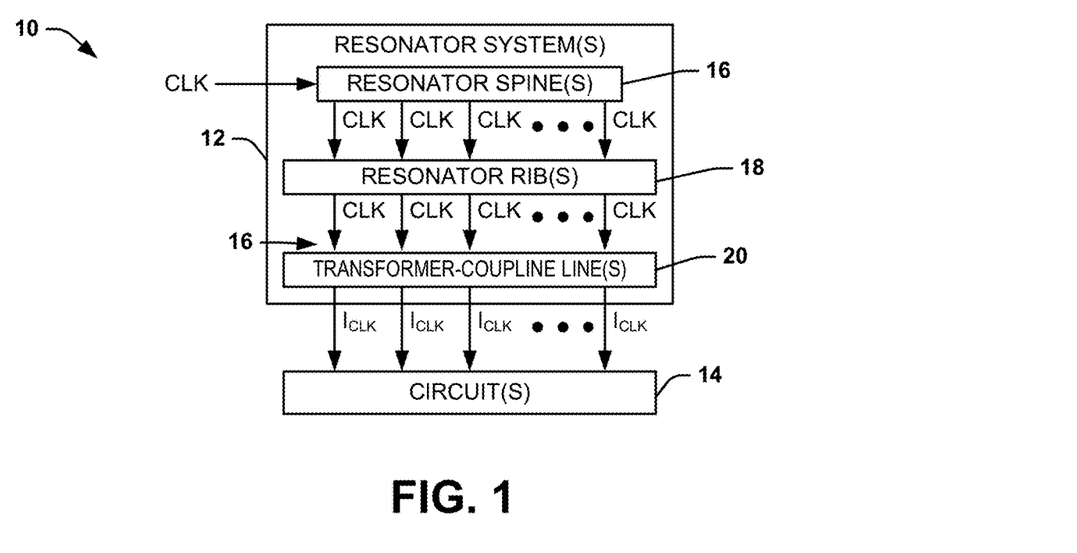
FIG. 1 illustrates an example of a clock distribution system.

FIG. 1 illustrates an example of a clock distribution system 10. The clock distribution system 10 can be implemented in a variety of applications, such as in a reciprocal quantum logic (RQL) circuit design. For example, the clock distribution system 10 can be implemented in or as part of an integrated circuit (IC) chip.

The clock distribution system 10 includes at least one resonator system 12. The resonator system(s) 12 can be configured to provide a clock signal CLK to each of a respective one or more circuits 14 that may be distributed across an IC chip in which the clock distribution system 10 is implemented, as described herein. As an example, the clock signal CLK can be provided as a sinusoidal clock signal, and can be one of an in-phase and a quadrature phase clock signal. In the example of FIG. 1, each of the resonator system(s) 12 includes at least one resonator spine 16 and at least one resonator rib 18. The resonator rib(s) 18 are each conductively coupled to a given one of the resonator spine(s) 16. Thus, the clock signal CLK, provided to the resonator spine(s) 16 (e.g., from a local oscillator), can be provided to propagate on each of the respective resonator rib(s) 18. As an example, the clock distribution system 10 can be arranged in a variety of different ways to distribute the clock signal CLK to the circuits 14, such as described in patent application Ser. No. 15/816,518, filed 17 Nov. 2017, that is incorporated herein in its entirety by reference. Therefore, the clock distribution system 10 can correspond to any of a variety of the different clock distribution architectures described in the aforementioned Patent Application. However, as described herein, the resonator rib(s) 18 can have a thickness that varies along a respective length.

In the example of FIG. 1, the resonator system 12 also includes at least one transformer-coupling line 20. Each of the transformer-coupling line(s) 20 can be inductively coupled to one or more of the resonator rib(s) 18 to inductively provide a clock current $I_{CLK}$ to an associated one of the circuit(s) 14. Particularly, the transformer-coupling line(s) 20 are inductively coupled to the respective resonator rib(s) 18 via a plurality of inductive couplings to inductively generate the clock current $I_{CLK}$ corresponding to the clock signal to provide functions (e.g., timing functions and/or power distribution functions) for the associated circuit(s) 14. As described herein, there can be a multitude of different configurations of the resonator rib(s) 18 and spine(s) 16, and thus a multitude of different ways to provide the inductive couplings of the transformer-coupling line(s) 20 to the resonator rib(s) 18. In each of the different configurations described herein, the inductive couplings of a given one of the transformer-coupling line(s) 20 to the resonator rib(s) 18 is provided in a manner that affects the amplitude of the induced clock current $I_{CLK}$ in the given one of the transformer-coupling line(s) 20. As an example, the tapered thickness of the resonator rib(s) 18 can be varied to mitigate non-uniformity of the induced clock current $I_{CLK}$ in the given one of the transformer-coupling line(s) 20 relative to a different one of the transformer-coupling line(s) 20 that is likewise inductively coupled to the same resonator rib(s) 18. As another example, the tapered thickness of the resonator rib(s) 18 can be varied to introduce variation or non-uniformity of the induced clock current $I_{CLK}$ in the given one of the transformer-coupling line(s) 20 relative to a different one of the transformer-coupling line(s) 20 that is likewise inductively coupled to the same resonator rib(s) 18.

As an example, each of the resonator rib(s) 18 can have a thickness that varies along the length of the respective resonator rib 18. Because the inductive coupling of the transformer coupling line(s) 20 and the resonator rib(s) 18 can be based on the thickness of the respective resonator rib(s) 18 at a given portion of the respective resonator rib(s) 18, the inductive coupling of the transformer coupling line(s) 20 and the resonator rib(s) can be controlled based on the relative thickness of the resonator rib(s) 18. Accordingly, the variation of the thickness of the resonator rib(s) 18 along the length of the of the respective resonator rib(s) 18 can provide a manner that mitigates non-uniformity of the induced clock current in a given transformer-coupling line relative to a different transformer-coupling line inductively coupled to the same resonator rib(s) 18.

As a first example, the thickness can vary in a tapered manner along the length of the respective resonator rib(s) 18. As described herein, the term "tapered" with respect to the thickness refers to a gradual change in thickness along the length of the resonator rib(s) 18, and can correspond to a linear or non-linear (e.g., exponential, root, or sinusoidal) change in the thickness along the length of the respective resonator rib(s) 18. As a second example, the thickness can vary in a step-wise manner along the length of the respective resonator rib(s) 18. As described herein, the term "step-wise" with respect to the thickness refers to discrete step changes in thickness along the length of the resonator rib(s) 18, such that the thickness remains constant along multiple different unequal thickness portions along the length of the respective resonator rib(s) 18.

Figure 2:
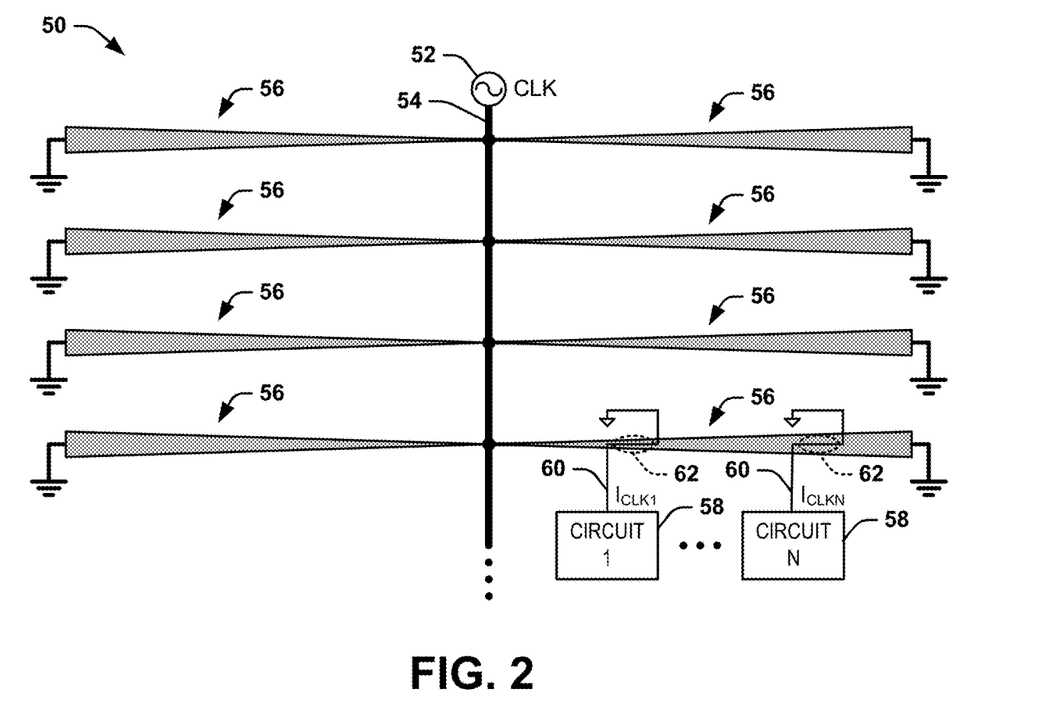
FIG. 2 illustrates an example of a resonator system.

FIG. 2 illustrates an example of a resonator system 50. The resonator system 50 can correspond to one of the resonator system(s) 12 in the example of FIG. 1. Therefore, reference is to be made to the example of FIG. 1 in the following description of the example of FIG. 2.

The resonator system 50 includes a signal source 52 that is configured to provide the clock signal CLK. The signal source 52 is coupled to a resonator spine 54 that is arranged as a conductor to propagate the clock signal CLK. In the example of FIG. 2, the resonator system 50 includes a plurality of resonator ribs 56 that are conductively coupled to the resonator spine 54 to likewise propagate the clock signal CLK. As an example, each of the resonator ribs 56 can be configured as standing-wave resonators, such that each of the resonator ribs 56 can have a physical length that is approximately equal to a predetermined length associated with a wavelength of the clock signal CLK. For example, each of the resonator ribs 56 can have a total length "L" from the conductive coupling to the resonator spine 54 at a first end to a second end that is coupled to a low-voltage rail (e.g., ground) that is approximately equal to one-quarter of the wavelength λ of the clock signal CLK (i.e., λ/4). Therefore, based on the standing-wave resonator configuration of the resonator ribs 56, the clock signal CLK can have a magnitude that is greatest at the second end, and is least at the first end. Additionally, in the example of FIG. 2, each of the resonator ribs 56 is demonstrated as a linear extension (e.g., straight) from the resonator spine 54 at the first end to the low-voltage rail at the second end. Additionally, each of the resonator ribs 56 is demonstrated as being tapered from the second end to the first end.

In the example of FIG. 2, a plurality N of circuits 58 are each demonstrated as inductively coupled to one of the resonator ribs 56 via a respective transformer-coupling line 60. The inductive coupling of the respective circuits 58 to the resonator rib 56 is provided through an inductive coupling 62 associated with each respective transformer-coupling line 60. The inductive coupling 62 is between a respective inductive-coupling portion of the transformer-coupling line 60 and a portion of the resonator rib 56. Therefore, the transformer-coupling line 60 cooperates with the resonator rib 56 to form a transformer at the inductive coupling 62, such that the inductive coupling 62 provides a portion of the clock signal CLK to be induced as a portion of respective clock currents $I_{CLK1}$ through $I_{CLKN}$ that are provided to the respective circuits 58. Thus, the inductive coupling 62 inductively provides the clock current $I_{CLK}$ corresponding to the clock signal CLK to the respective circuit 58.

As described herein, the inductive coupling 62 of a transformer coupling line 60 and a resonator rib 56 can be based on the thickness of the respective resonator rib 56 at a given portion of the respective resonator rib 56. For example, the inductive coupling 62 can be the greater for portions of the resonator rib 56 that are thinner than for portions of the resonator rib 56 that are thicker. Additionally, as described previously, the clock signal CLK can have an amplitude that is greatest at the second end, and is least at the first end. Therefore, in the example of FIG. 2, the tapered thickness of the resonator rib 56 can be such that the inductive coupling 62 varies inversely with the variation of the amplitude of the clock signal CLK. In other words, the inductive coupling 62 can be the least at the second end of the resonator rib 56 where the amplitude of the clock signal CLK is the greatest, and the inductive coupling 62 can be the greatest at the first end of the resonator rib 56 where the amplitude of the clock signal CLK is the least. Accordingly, the variation of the thickness of the resonator rib 56 along the length of the of the respective resonator rib 56 can provide a manner that mitigates non-uniformity of the induced clock currents $I_{CLK1}$ through $I_{CLKN}$ along the same resonator rib 56.

Figure 3:
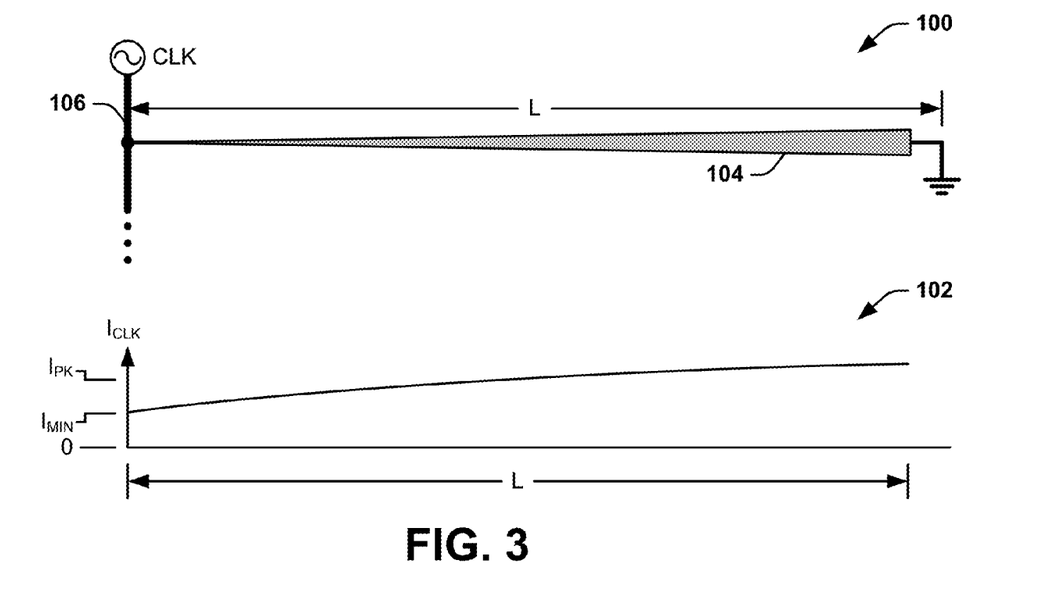
FIG. 3 illustrates an example of a resonator system and a graph of current.

FIG. 3 illustrates another example of a resonator system 100 and a graph 102 of clock current $I_{CLK}$. The resonator system 100 can correspond to a portion of the resonator spine 54 and one of the resonator ribs 56 in the example of FIG. 2. Particularly, in the example of FIG. 3, the resonator system 100 includes a resonator rib 104 that is conductively coupled at a first end to a resonator spine 106 and second end opposite the first end that is grounded. The resonator rib 104 is demonstrated as having a length "L" between the first end and the second end. In the example of FIG. 3, the resonator rib 104 is demonstrated as a linear extension (e.g., straight) from the resonator spine 104 at the first end to the low-voltage rail at the second end. Additionally, the resonator rib 104 is demonstrated as having a thickness that is tapered from the second end to the first end. In the example of FIG. 3, the thickness is demonstrated as tapered in a linear manner.

The graph 102 demonstrates an amplitude of the induced clock current $I_{CLK}$ (e.g., as provided in the transformer-coupling line 60) as a function of the length "L" of the resonator rib 104. As demonstrated in the example of FIG. 3, the clock current $I_{CLK}$ increases along the length "L" from left to right, and thus from the first end (e.g., the conductive coupling of the resonator rib 104 to the resonator spine 106) and along the length of the resonator rib 104 to the second end that is grounded. Particularly, the clock current $I_{CLK}$ increases from an amplitude $I_{MIN}$ at the left to the amplitude $I_{PK}$ at the grounded end, and thus is demonstrated in the example of FIG. 3 as increasing in a tilted manner (e.g., based on the clock current $I_{CLK}$ increasing from one end of the length "L" to the opposite end of the length "L") and is bowed (e.g., is non-linear along the length "L"). In the example of FIG. 3, the amplitude $I_{MIN}$ can be close in amplitude to the amplitude $I_{PK}$, such that the current $I_{CLK}$ can vary significantly less along the length of the resonator rib 104 than a standing wave resonator rib having a constant thickness along the length. As a result, the variation of the thickness of the resonator rib 104 along the length can provide a manner that mitigates non-uniformity of induced clock currents of inductively-coupled circuits (e.g., the circuits 58 in the example of FIG. 2) along the resonator rib 104.

Figure 4:
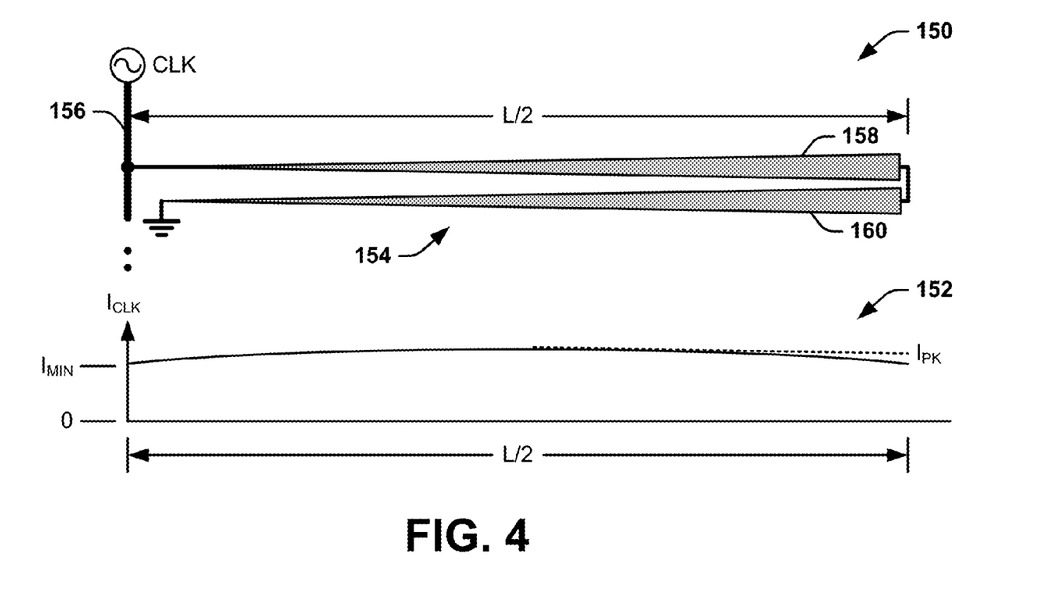
FIG. 4 illustrates another example of a resonator system and a graph of current.

FIG. 4 illustrates yet another example of a resonator system 150 and a graph 152 of clock current $I_{CLK}$. The resonator system 150 can correspond to a portion of the resonator spine 54 and one of the resonator ribs 56 in the example of FIG. 2. Particularly, in the example of FIG. 4, the resonator system 150 includes a resonator rib 154 that is conductively coupled to a resonator spine 156 and which includes a grounded end opposite the conductive coupling to the resonator spine 156. The resonator rib 154 is demonstrated as including bends to be arranged as including a first parallel portion 158 and a second parallel portion 160. The first parallel portion 158 has a first end that is conductively coupled to the resonator spine 156 and a second end that is coupled to a first end of the second parallel portion 160, with the second end of the second parallel portion 160 having a second end that is grounded.

The graph 152 demonstrates an amplitude of the induced clock current $I_{CLK}$ (e.g., as provided in the transformer-coupling line 60) as a function of the length "L/2" of the resonator rib 154. The length "L/2" of the graph 152 corresponds directly to approximately half the length "L" of the resonator rib 154 if fully extended, and thus corresponds to an approximate length of each of the parallel portions 158 and 160. Therefore, the length "L/2" in the graph 152 extends from the conductive coupling of the resonator rib 154 to the resonator spine 156 and along approximately half the length of the resonator rib 154, at approximately the bends, and again from approximately the bends along the length of the resonator rib 154 to the grounded end (from right to left).

In the example of FIG. 4, each of the parallel portions 158 and 160 has a thickness that varies along the respective lengths of the parallel portions 158 and 160. Particularly, each of the parallel portions 158 and 160 has a thickness that is tapered from a maximum thickness at a first end of each of the parallel portions 158 and 160 to a minimum thickness at a second end of each of the parallel portions 158 and 160. In the example of FIG. 4, the tapered thickness along the length of each of the parallel portions 158 and 160 is demonstrated as linear. Therefore, similar to as described previously, the tapered thickness can vary the inductive coupling (e.g., vary the strength of the mutual inductance) between the resonator rib 154 and the transformer coupling line (not shown) that is inductively coupled to the resonator rib 154.

In the example of FIG. 4, the clock current $I_{CLK}$ is demonstrated along the length "L/2" from left to right. The clock current $I_{CLK}$ can correspond to an aggregate clock current $I_{CLK}$ associated with an inductive coupling of a single transformer coupling line to both of the parallel portions 158 and 160, such that the clock current $I_{CLK}$ corresponds to an additive clock current from each of the respective inductive couplings (e.g., similar to as demonstrated in patent application Ser. No. 15/816,518). Therefore, the clock current $I_{CLK}$ is a summation current that is representative of a sum of the clock currents $I_{CLK}$ along the length of the respective parallel portions 158 and 160. Particularly, the clock current $I_{CLK}$ varies in amplitude from approximately the amplitude $I_{MIN}$ to a maximum amplitude $I_{PK}$ that is approximately half the length of the length "L/2" (i.e., approximately one quarter a total length "L" of the resonator rib 154). However, because the clock current $I_{CLK}$ varies across the length "L/2" of each of the parallel portions 158 and 160, and because such variation increases in opposing directions with respect to the parallel portions 158 and 160, the clock current $I_{CLK}$ can have a small variation in amplitude between the amplitude $I_{MIN}$ and the amplitude $I_{PK}$. Particularly, the clock current $I_{CLK}$ can have a variation in amplitude that is less than a resonator rib having two parallel portions of approximately constant thickness (e.g., such as described in patent application Ser. No. 15/816,518). As a result, the variation of the thickness of the resonator rib 154 along the length can provide a manner that mitigates non-uniformity of induced clock currents of circuits (e.g., the circuits 58 in the example of FIG. 2) that are inductively coupled to both of the parallel portions 158 and 160 along the resonator rib 154.

Figure 5:
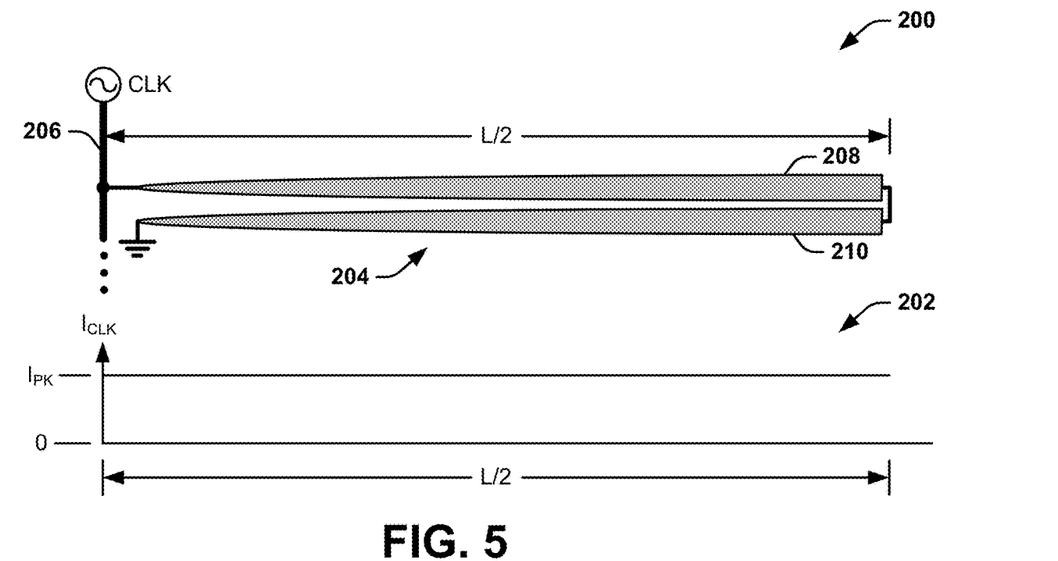
FIG. 5 illustrates another example of a resonator system and a graph of current.

FIG. 5 illustrates yet another example of a resonator system 200 and a graph 202 of clock current $I_{CLK}$. The resonator system 200 can correspond to a portion of the resonator spine 54 and one of the resonator ribs 56 in the example of FIG. 2. Particularly, in the example of FIG. 5, the resonator system 200 includes a resonator rib 204 that is conductively coupled to a resonator spine 206 and which includes a grounded end opposite the conductive coupling to the resonator spine 206. The resonator rib 204 is demonstrated as including bends to be arranged as including a first parallel portion 208 and a second parallel portion 210. The first parallel portion 208 has a first end that is conductively coupled to the resonator spine 206 and a second end that is coupled to a first end of the second parallel portion 210, with the second end of the second parallel portion 210 having a second end that is grounded.

The graph 202 demonstrates an amplitude of the induced clock current $I_{CLK}$ (e.g., as provided in the transformer-coupling line 60) as a function of the length "L/2" of the resonator rib 204. The length "L/2" of the graph 202 corresponds directly to approximately half the length "L" of the resonator rib 204 if fully extended, and thus corresponds to an approximate length of each of the parallel portions 208 and 210. Therefore, the length "L/2" in the graph 202 extends from the conductive coupling of the resonator rib 204 to the resonator spine 206 and along approximately half the length of the resonator rib 204, at approximately the bends, and again from approximately the bends along the length of the resonator rib 204 to the grounded end (from right to left).

In the example of FIG. 5, each of the parallel portions 208 and 210 has a thickness that varies along the respective lengths of the parallel portions 208 and 210. Particularly, each of the parallel portions 208 and 210 has a thickness that is tapered from a maximum thickness at a first end of each of the parallel portions 208 and 210 to a minimum thickness at a second end of each of the parallel portions 208 and 210. In the example of FIG. 5, the tapered thickness along the length of each of the parallel portions 208 and 210 is demonstrated as non-linear, such as sinusoidal or exponential. Therefore, similar to as described previously, the tapered thickness can vary the inductive coupling (e.g., vary the strength of the mutual inductance) between the resonator rib 204 and the transformer coupling line (not shown) that is inductively coupled to the resonator rib 204. Additionally, while the example of FIG. 5 demonstrates a non-linear variable thickness for each of the parallel portions 208 and 210, it is to be understood that additional variations of the variable thickness are possible. For example, one of the parallel portions 208 and 210 can have a linear variable thickness while the other of the parallel portions 208 and 210 has a non-linear variable thickness. As yet another example, one of the parallel portions 208 can 210 could have a non variable thickness. Accordingly, the resonator rib 204 can be arranged in any of a variety of different ways.

In the example of FIG. 5, the clock current $I_{CLK}$ is demonstrated along the length "L/2" from left to right. The clock current $I_{CLK}$ can correspond to an aggregate clock current $I_{CLK}$ associated with an inductive coupling of a single transformer coupling line to both of the parallel portions 208 and 210, such that the clock current $I_{CLK}$ corresponds to an additive clock current from each of the respective inductive couplings (e.g., similar to as demonstrated in patent application Ser. No. 15/816,518). Therefore, the clock current $I_{CLK}$ is a summation current that is representative of a sum of the clock currents $I_{CLK}$ along the length of the respective parallel portions 208 and 210. Particularly, the clock current $I_{CLK}$ is demonstrated in the example of FIG. 5 as having an approximately constant amplitude $I_{PK}$ along the length "L/2". As an example, because the clock current $I_{CLK}$ varies across the length "L/2" of each of the parallel portions 208 and 210, and because of the non-linear tapered thickness of the parallel portions 208 and 210, the variation can result in a summation clock current $I_{CLK}$ that is approximately constant along the length of the "L/2". As a result, the variation of the thickness of the resonator rib 204 along the length can provide a manner that mitigates non-uniformity of induced clock currents of circuits (e.g., the circuits 58 in the example of FIG. 2) that are inductively coupled to both of the parallel portions 208 and 210 along the resonator rib 204.

Figure 6:
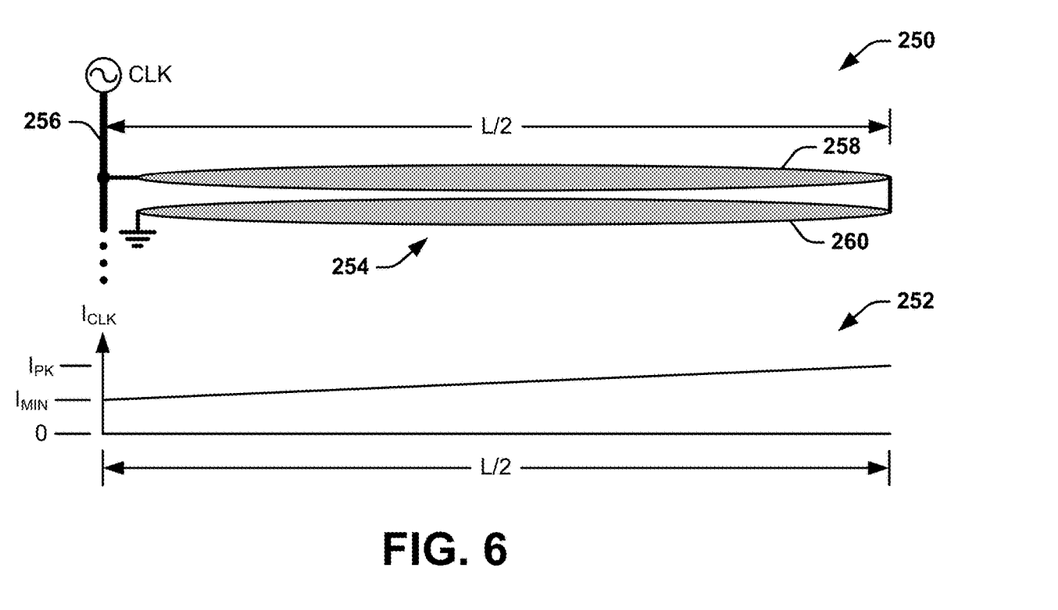
FIG. 6 illustrates another example of a resonator system and a graph of current.

FIG. 6 illustrates yet another example of a resonator system 250 and a graph 252 of clock current $I_{CLK}$. The resonator system 250 can correspond to a portion of the resonator spine 54 and one of the resonator ribs 56 in the example of FIG. 2. Particularly, in the example of FIG. 6, the resonator system 250 includes a resonator rib 254 that is conductively coupled to a resonator spine 256 and which includes a grounded end opposite the conductive coupling to the resonator spine 256. The resonator rib 254 is demonstrated as including bends to be arranged as including a first parallel portion 258 and a second parallel portion 260. The first parallel portion 258 has a first end that is conductively coupled to the resonator spine 256 and a second end that is coupled to a first end of the second parallel portion 260, with the second end of the second parallel portion 260 having a second end that is grounded.

The graph 252 demonstrates an amplitude of the induced clock current $I_{CLK}$ (e.g., as provided in the transformer-coupling line 60) as a function of the length "L/2" of the resonator rib 254. The length "L/2" of the graph 252 corresponds directly to approximately half the length "L" of the resonator rib 254 if fully extended, and thus corresponds to an approximate length of each of the parallel portions 258 and 260. Therefore, the length "L/2" in the graph 252 extends from the conductive coupling of the resonator rib 254 to the resonator spine 256 and along approximately half the length of the resonator rib 254, at approximately the bends, and again from approximately the bends along the length of the resonator rib 254 to the grounded end (from right to left).

In the example of FIG. 6, each of the parallel portions 258 and 260 has a thickness that varies along the respective lengths of the parallel portions 258 and 260. Particularly, each of the parallel portions 258 and 260 has a thickness that is tapered from a maximum thickness to a first minimum thickness at the first end of each of the parallel portions 258 and 260 and to a second minimum thickness at the second end of each of the parallel portions 258 and 260. As an example, the first and second minimum thicknesses of each of the first and second ends of each of the respective parallel portions 258 and 260 can be approximately equal. As another example, the maximum thickness of each of the parallel portions 258 and 260 can be approximately half the length between the first and second ends of each of the first and second parallel portions 258 and 260. In the example of FIG. 6, the tapered thickness is demonstrated as non-linear (e.g., sinusoidal or exponential) from the maximum in the approximate center to the minimum at each end. However, as yet another example, the tapered thickness can be approximately linear. Therefore, similar to as described previously, the tapered thickness can vary the inductive coupling (e.g., vary the strength of the mutual inductance) between the resonator rib 254 and the transformer coupling line (not shown) that is inductively coupled to the resonator rib 254.

In the example of FIG. 6, the clock current $I_{CLK}$ is demonstrated along the length "L/2" from left to right. The clock current $I_{CLK}$ can correspond to an aggregate clock current $I_{CLK}$ associated with an inductive coupling of a single transformer coupling line to both of the parallel portions 258 and 260, such that the clock current $I_{CLK}$ corresponds to an additive clock current from each of the respective inductive couplings (e.g., similar to as demonstrated in patent application Ser. No. 15/816,518). Therefore, the clock current $I_{CLK}$ is a summation current that is representative of a sum of the clock currents $I_{CLK}$ along the length of the respective parallel portions 258 and 260. Particularly, the clock current $I_{CLK}$ increases from an amplitude $I_{MIN}$ at the left to the amplitude $I_{PK}$ along the length "L/2", and thus is demonstrated in the example of FIG. 6 as increasing in a tilted manner (e.g., based on the clock current $I_{CLK}$ increasing from one end of the length "L/2" to the opposite end of the length "L/2") in an approximately linear manner (e.g., is non-bowed along the length "L/2"). Particularly, the clock current $I_{CLK}$ varies in amplitude from approximately the amplitude $I_{MIN}$ to a maximum amplitude $I_{PK}$ that is approximately at the length "L/2" (i.e., approximately one half the total length "L" of the resonator rib 254). However, because the clock current $I_{CLK}$ varies across the length "L/2" of each of the parallel portions 258 and 260, and because such variation increases in opposing directions with respect to the parallel portions 258 and 260, the clock current $I_{CLK}$ can have an amplitude variation in amplitude between the amplitude $I_{MIN}$ and the amplitude $I_{PK}$. However, the clock current $I_{CLK}$ can have a variation in amplitude that is less than a resonator rib having two parallel portions of approximately constant thickness (e.g., such as described in patent application Ser. No. 15/816,518). As a result, the variation of the thickness of the resonator rib 254 along the length can provide a manner that mitigates non-uniformity of induced clock currents of circuits (e.g., the circuits 58 in the example of FIG. 2) that are inductively coupled to both of the parallel portions 258 and 260 along the resonator rib 254.

Figure 7:
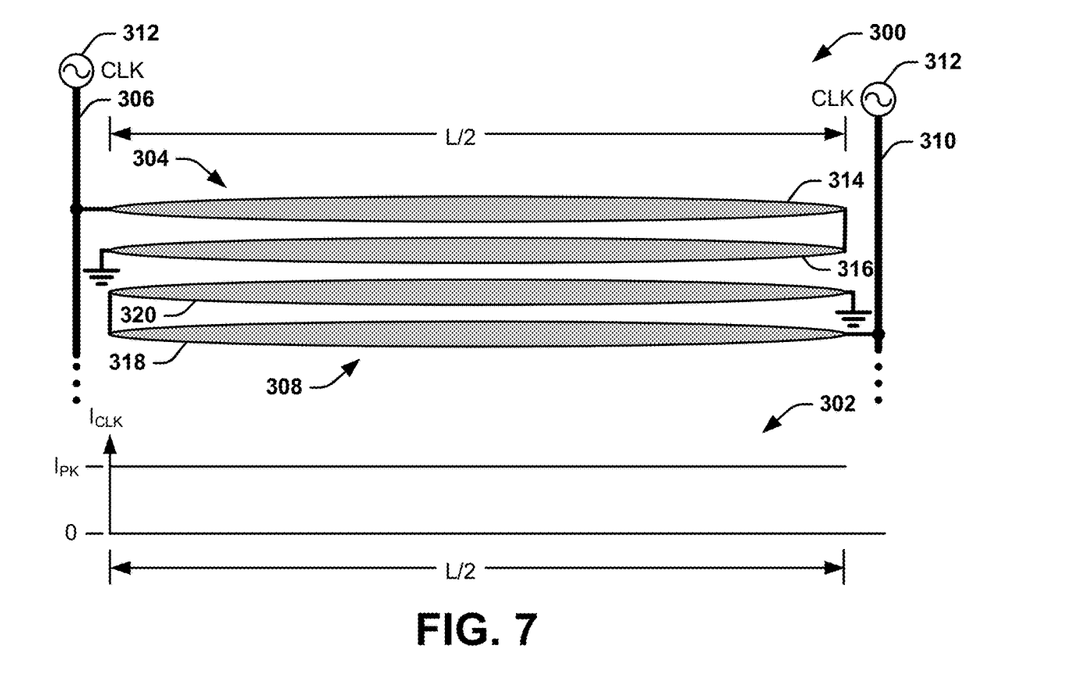
FIG. 7 illustrates another example of a resonator system and a graph of current.

FIG. 7 illustrates yet another example of a resonator system 300 and a graph 302 of clock current $I_{CLK}$. The resonator system 300 can correspond to a portion of the resonator spine 54 and one of the resonator ribs 56 in the example of FIG. 2. Particularly, in the example of FIG. 7, the resonator system 300 includes a first resonator rib 304 that is conductively coupled to a first resonator spine 306 and which includes a grounded end opposite the conductive coupling to the first resonator spine 306, and further includes a second resonator rib 308 that is conductively coupled to a second resonator spine 310 and which likewise includes a grounded end opposite the conductive coupling to the second resonator spine 310. Each of the first and second resonator spines 306 and 310 are demonstrated as propagating the clock signal CLK from respective signal sources 312. As an example, the signal sources 312 can correspond to the same signal source, or could be different signal sources that each provides the clock signal CLK. As another example, the first and second resonator spines 306 and 310 could correspond to the same resonator spine that propagates the clock signal CLK.

The first resonator rib 304 is demonstrated as including bends to be arranged as including a first parallel portion 314 that is conductively coupled to the resonator spine 306 and a second parallel portion 316 that has a grounded end. Similarly, the second resonator rib 308 is demonstrated as including bends to be arranged as including a first parallel portion 318 that is conductively coupled to the resonator spine 310 and a second parallel portion 320 that has a grounded end. Therefore, the first and second resonator ribs 304 and 308 are arranged approximately identically with respect to each other. However, in the example of FIG. 7, the first and second resonator ribs 304 and 308 are demonstrated as being arranged in an anti-parallel arrangement with each other, in that the first and second resonator ribs 304 and 308 are arranged opposite each other with respect to the orientation from coupling to the respective one of the resonator spines 306 and 310 to the respective grounded ends.

The graph 302 demonstrates an amplitude of the induced clock current $I_{CLK}$ (e.g., as provided in the transformer-coupling line 60) as a function of the length "L/2" each of the resonator ribs 304 and 308. The length "L/2" of the graph 302 corresponds directly to approximately half the length "L" of each of the resonator ribs 304 and 308 if fully extended, and thus corresponds to an approximate length of each of the parallel portions 314, 316, 318, and 320.

In the example of FIG. 7, each of the parallel portions 314, 316, 318, and 320 has a thickness that varies along the respective lengths of the parallel portions 314, 316, 318, and 320. Particularly, each of the parallel portions 314, 316, 318, and 320 has a thickness that is tapered from a maximum thickness to a first minimum thickness at the first end of each of the parallel portions 314, 316, 318, and 320 and to a second minimum thickness at the second end of each of the parallel portions 314, 316, 318, and 320. As an example, the first and second minimum thicknesses of each of the first and second ends of each of the respective parallel portions 314, 316, 318, and 320 can be approximately equal. As another example, the maximum thickness of each of the parallel portions 314, 316, 318, and 320 can be approximately half the length between the first and second ends of each of the first and second parallel portions 314, 316, 318, and 320. In the example of FIG. 7, the tapered thickness is demonstrated as non-linear (e.g., sinusoidal or exponential) from the maximum in the approximate center to the minimum at each end. However, as yet another example, the tapered thickness can be approximately linear. Therefore, similar to as described previously, the tapered thickness can vary the inductive coupling (e.g., vary the strength of the mutual inductance) between the resonator ribs 304 and 308 and the transformer coupling line (not shown) that is inductively coupled to each of the resonator ribs 304 and 308.

In the example of FIG. 7, the clock current $I_{CLK}$ is demonstrated along the length "L/2" from left to right. The clock current $I_{CLK}$ can correspond to an aggregate clock current $I_{CLK}$ associated with an inductive coupling of a single transformer coupling line to all of the parallel portions 314, 316, 318, and 320, such that the clock current $I_{CLK}$ corresponds to an additive clock current from each of the respective inductive couplings (e.g., similar to as demonstrated in patent application Ser. No. 15/816,518). Therefore, the clock current $I_{CLK}$ is a summation current that is representative of a sum of the clock currents $I_{CLK}$ along the length of the respective parallel portions 314, 316, 318, and 320. Particularly, the clock current $I_{CLK}$ is demonstrated in the example of FIG. 7 as having an approximately constant amplitude $I_{PK}$ along the length "L/2". As an example, because the clock current $I_{CLK}$ varies across the length "L/2" of each of the parallel portions 314, 316, 318, and 320, and because of the non-linear tapered thickness of the parallel portions 314, 316, 318, and 320, the variation can result in a summation clock current $I_{CLK}$ that is approximately constant along the length of the "L/2". As a result, the variation of the thickness of the resonator ribs 304 and 308 along the length can provide a manner that mitigates non-uniformity of induced clock currents of circuits (e.g., the circuits 58 in the example of FIG. 2) that are inductively coupled to the parallel portions 314, 316, 318, and 320 along the respective resonator ribs 304 and 308.

While the example of FIG. 7 demonstrates that all of the parallel portions 314, 316, 318, and 320 are demonstrated as having a variable thickness, and that the variable thickness is a non-linear tapered thickness from approximately half the length of the respective parallel portions 314, 316, 318, and 320 to the respective ends, it is to be understood that other variations are possible. For example, the tapered thickness can be linear, and can be from a maximum thickness at a first end of one of the parallel portions 314, 316, 318, and 320 to a minimum thickness at a second end of the respective one of the parallel portions 314, 316, 318, and 320. As another example, not all of the parallel portions 314, 316, 318, and 320 can have a variable thickness. For example, one of the parallel portions 314 and 316 of the first resonator rib 304 and one of the parallel portions 318 and 320 of the second resonator rib 308 can have a non variable thickness along the respective length. Accordingly, any of a variety of variations of variable thickness of at least one of the parallel portions 314, 316, 318, and 320 is possible.

Figure 8:
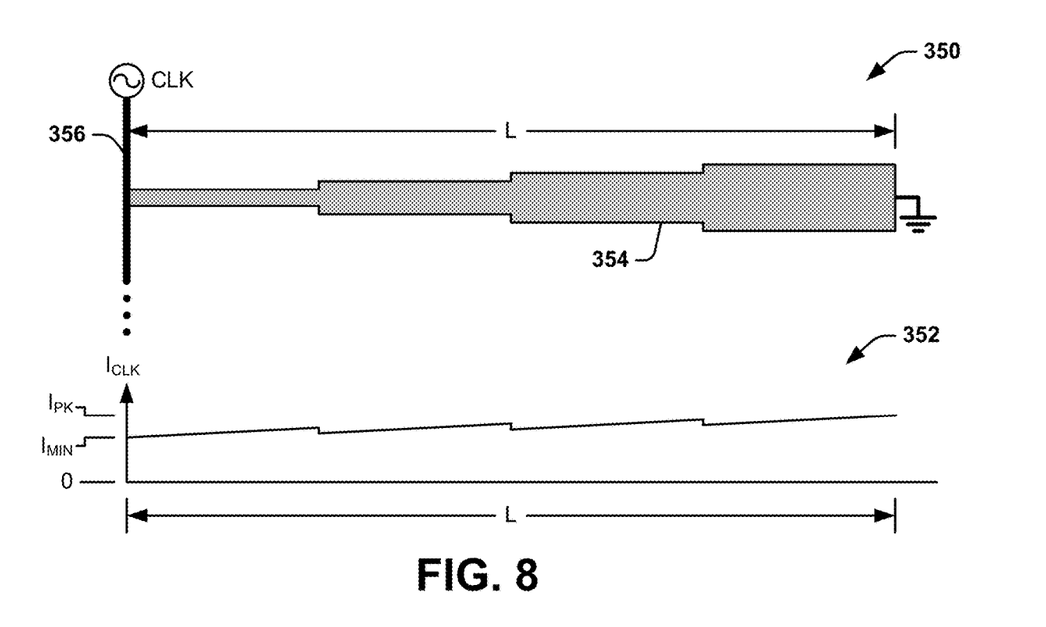
FIG. 8 illustrates another example of a resonator system and a graph of current.

FIG. 8 illustrates another example of a resonator system 350 and a graph 352 of clock current $I_{CLK}$. The resonator system 350 can correspond to a portion of the resonator spine 54 and one of the resonator ribs 56 in the example of FIG. 2. Particularly, in the example of FIG. 8, the resonator system 350 includes a resonator rib 354 that is conductively coupled at a first end to a resonator spine 356 and second end opposite the first end that is grounded. The resonator rib 354 is demonstrated as having a length "L" between the first end and the second end.

In the example of FIG. 8, the resonator rib 354 is demonstrated as a linear extension (e.g., straight) from the resonator spine 354 at the first end to the low-voltage rail at the second end. Additionally, the resonator rib 354 is demonstrated as having a thickness that increases in a step-wise manner from the first end to the second end. Particularly, in the example of FIG. 8, the resonator rib 354 includes four discrete portions that each have an approximately constant thickness, but have thicknesses that are progressively larger from the first end to the second end. While the resonator rib 354 is demonstrated as including four discrete portions of approximately constant thickness, it is to be understood that the resonator rib 354 could instead include more or less than four discrete portions of approximately constant thickness to vary the thickness in the step-wise manner. As another example, the resonator rib 354 is not limited to discrete portions of approximately constant thickness, but could instead of discrete portions of approximately linear tapered thickness. For example, due to fabrication processing, each of the discrete portions can have a tapered thickness (e.g., linear or nonlinear) that is different with respect to each of the discrete portions.

The graph 352 demonstrates an amplitude of the induced clock current $I_{CLK}$ (e.g., as provided in the transformer-coupling line 60) as a function of the length "L" of the resonator rib 354. As demonstrated in the example of FIG. 8, the clock current $I_{CLK}$ increases along the length "L" from left to right, and thus from the first end (e.g., the conductive coupling of the resonator rib 354 to the resonator spine 356) and along the length of the resonator rib 354 to the second end that is grounded. Particularly, the clock current $I_{CLK}$ increases from an amplitude $I_{MIN}$ at the left to the amplitude $I_{PK}$ at the grounded end. In the example of FIG. 8, the amplitude $I_{MIN}$ can be only slightly less than the amplitude $I_{PK}$, such that the current $I_{CLK}$ can vary significantly less along the length of the resonator rib 354 than a standing wave resonator rib having a constant thickness along the length. Additionally, at each transition from one discrete portion of the resonator rib 354 to a next discrete portion of the resonator rib, the clock current $I_{CLK}$ can decrease slightly based on the change in inductance resulting from the change in thickness of the resonator rib 354 in the step-wise manner. Therefore, the amplitude of the clock current $I_{CLK}$ can maintain an approximate uniformity across the length of the resonator rib 354. As a result, the variation of the thickness of the resonator rib 354 along the length can provide a manner that mitigates non-uniformity of induced clock currents of inductively-coupled circuits (e.g., the circuits 58 in the example of FIG. 2) along the resonator rib 354.

Figure 9:
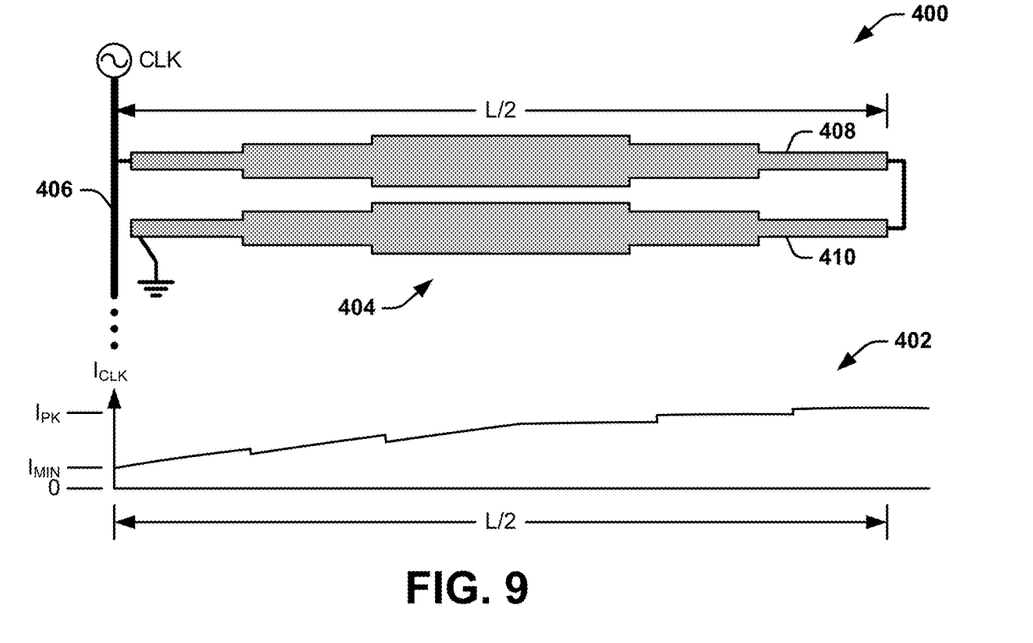
FIG. 9 illustrates another example of a resonator system and a graph of current.

FIG. 9 illustrates yet another example of a resonator system 400 and a graph 402 of clock current $I_{CLK}$. The resonator system 400 can correspond to a portion of the resonator spine 54 and one of the resonator ribs 56 in the example of FIG. 2. Particularly, in the example of FIG. 9, the resonator system 400 includes a resonator rib 404 that is conductively coupled to a resonator spine 406 and which includes a grounded end opposite the conductive coupling to the resonator spine 406. The resonator rib 404 is demonstrated as including bends to be arranged as including a first parallel portion 408 and a second parallel portion 410. The first parallel portion 408 has a first end that is conductively coupled to the resonator spine 406 and a second end that is coupled to a first end of the second parallel portion 410, with the second end of the second parallel portion 410 having a second end that is grounded.

The graph 402 demonstrates an amplitude of the induced clock current $I_{CLK}$ (e.g., as provided in the transformer-coupling line 60) as a function of the length "L/2" of the resonator rib 404. The length "L/2" of the graph 402 corresponds directly to approximately half the length "L" of the resonator rib 404 if fully extended, and thus corresponds to an approximate length of each of the parallel portions 408 and 410. Therefore, the length "L/2" in the graph 402 extends from the conductive coupling of the resonator rib 404 to the resonator spine 406 and along approximately half the length of the resonator rib 404, at approximately the bends, and again from approximately the bends along the length of the resonator rib 404 to the grounded end (from right to left).

In the example of FIG. 9, each of the parallel portions 408 and 410 has a thickness that varies along the respective lengths of the parallel portions 408 and 410. Particularly, each of the parallel portions 408 and 410 has a thickness that increases in a step-wise manner from a first minimum thickness at the first end of each of the parallel portions 408 and 410 and from a second minimum thickness at the second end of each of the parallel portions 408 and 410 to a maximum thickness between the first and second parallel portions 408 and 410. In the example of FIG. 9, each of the parallel portions 408 and 410 includes five discrete portions of approximately constant thickness. While the example of FIG. 9 demonstrates that both of (e.g., each of) the parallel portions 408 and 410 have a variable thickness along the length of the respective parallel portions 408 and 410, it is to be understood that less than all (e.g., only one in the example of FIG. 9) of the parallel portions can have a variable thickness, and that the remaining parallel portions can have a variety of other dimensional arrangements (e.g., a static thickness along the length). Additionally, similar to as described previously, other variations of variable thickness can be implemented. For example, the discrete step-wise portions can each have a variable thickness along the respective lengths. As another example, an additional resonator rib can be implemented (e.g., similar to as described previously in the example of FIG. 7), which can have one or more parallel portions that include a non-variable thickness, or can have a non-stepwise variable thickness. Accordingly, a variety of variable thickness resonator rib arrangements are possible as described herein.

As an example, the first and second minimum thicknesses of each of the first and second ends of each of the respective parallel portions 408 and 410 can be approximately equal, such that the discrete portions at each of the first and second ends are approximately equal thickness. As another example, the maximum thickness of each of the parallel portions 408 and 410 can be approximately half the length between the first and second ends of each of the first and second parallel portions 408 and 410, such that the most central discrete portion has an approximately constant maximum thickness. As yet another example, it is to be understood that the parallel portions 408 and 410 are not limited to being symmetrical about half-way along the respective lengths. Therefore, similar to as described previously, the tapered thickness can vary the inductive coupling (e.g., vary the strength of the mutual inductance) between the resonator rib 404 and the transformer coupling line (not shown) that is inductively coupled to the resonator rib 404.

In the example of FIG. 9, the clock current $I_{CLK}$ is demonstrated along the length "L/2" from left to right. The clock current $I_{CLK}$ can correspond to an aggregate clock current $I_{CLK}$ associated with an inductive coupling of a single transformer coupling line to both of the parallel portions 408 and 410, such that the clock current $I_{CLK}$ corresponds to an additive clock current from each of the respective inductive couplings (e.g., similar to as demonstrated in patent application Ser. No. 15/816,518). Therefore, the clock current $I_{CLK}$ is a summation current that is representative of a sum of the clock currents $I_{CLK}$ along the length of the respective parallel portions 408 and 410. Particularly, the clock current $I_{CLK}$ varies in amplitude from approximately the amplitude $I_{MIN}$ to a maximum amplitude $I_{PK}$ that is approximately half the length of the length "L/2" (i.e., approximately one quarter a total length "L" of the resonator rib 404). Particularly, the clock current $I_{CLK}$ increases from an amplitude $I_{MIN}$ at the left to the amplitude $I_{PK}$ along the length "L/2", and thus is demonstrated in the example of FIG. 9 as increasing in a tilted manner (e.g., based on the clock current $I_{CLK}$ increasing from one end of the length "L/2" to the opposite end of the length "L/2") and is bowed (e.g., has variable slope with respect to symmetrical portions of the resonator rib 404 along the length "L/2").

However, because the clock current $I_{CLK}$ varies across the length "L/2" of each of the parallel portions 408 and 410, and because such variation increases in opposing directions with respect to the parallel portions 408 and 410, the clock current $I_{CLK}$ can have a small variation in amplitude between the amplitude $I_{MIN}$ and the amplitude $I_{PK}$. Particularly, the clock current $I_{CLK}$ can have a variation in amplitude that is less than a resonator rib having two parallel portions of approximately constant thickness (e.g., such as described in patent application Ser. No. 15/816,518). Additionally, at each transition from one discrete portion of the respective parallel portions 408 and 410 to a next discrete portion of the respective parallel portions 408 and 410 from one of the first and second ends to the approximate middle of the respective parallel portions 408 and 410, the clock current $I_{CLK}$ can decrease slightly based on the change in inductance resulting from the change in thickness of the resonator rib 404 in the step-wise manner. Therefore, the amplitude of the clock current $I_{CLK}$ can maintain an approximate uniformity across the length of the respective parallel portions 408 and 410. As a result, the variation of the thickness of the resonator rib 404 along the length can provide a manner that mitigates non-uniformity of induced clock currents of circuits (e.g., the circuits 58 in the example of FIG. 2) that are inductively coupled to both of the parallel portions 408 and 410 along the resonator rib 404.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:
1. A clock distribution system comprising:
   at least one resonator spine that propagates a clock signal;
   at least one resonator rib conductively coupled to the at least one resonator spine and being arranged as a standing wave resonator, at least one of the at least one resonator rib having a thickness that varies along a length of the respective one of the at least one resonator rib; and
   at least one transformer-coupling line, each of the at least one transformer-coupling line being conductively coupled to an associated circuit and being inductively coupled to the at least one resonator rib to inductively generate a clock current corresponding to the clock signal to provide functions for the associated circuit.

2. The system of claim 1, wherein each of the at least one resonator rib comprises at least one bend to provide a plurality of parallel portions of each of the at least one resonator rib, each of the plurality of parallel portions comprising a first end and a second end, wherein the second end of the respective one of the plurality of parallel portions is conductively coupled to a first end of a next one of the plurality of parallel portions via one of the respective at least one bend, wherein the thickness of at least one of the plurality of parallel portions of the respective at least one resonator rib varies along a length of the respective one of the parallel portions.

3. The system of claim 2, wherein the at least one bend is a plurality of bends arranged to provide the plurality of parallel portions as greater than two parallel portions.

4. The system of claim 2, wherein the thickness of the at least one of the plurality of parallel portions of the respective at least one resonator rib increases from a first minimum thickness at the first end and from a second minimum thickness at the second end to a maximum thickness between the first end and the second end.

5. The system of claim 4, wherein the maximum thickness is located approximately half a length between the first end and the second end of the respective one of the plurality of parallel portions.

6. The system of claim 4, wherein the thickness of the at least one of the plurality of parallel portions of the respective at least one resonator rib increases in a step-wise manner from each of the first minimum thickness and the second minimum thickness to the maximum thickness.

7. The system of claim 4, wherein the thickness of the at least one of the plurality of parallel portions of the respective at least one resonator rib is tapered from the maximum thickness to each of the first minimum thickness and the second minimum thickness.

8. The system of claim 4, wherein the first and second minimum thicknesses are approximately equal.

9. The system of claim 1, wherein each of the at least one resonator rib is configured as a linear extension between a first end proximal to the at least one resonator spine and a second end coupled to a low-voltage rail.

10. The system of claim 9, wherein the thickness of the at least one resonator rib is tapered from the second end to the first end.

11. The system of claim 9, wherein the thickness of the at least one resonator rib increases in a step-wise manner from the first end to the second end.

12. A clock distribution system comprising:
at least one resonator spine that propagates a clock signal;
at least one resonator rib conductively coupled to the at least one resonator spine and being arranged as a standing wave resonator, at least one of the at least one resonator rib having a thickness that varies in a tapered manner along a length of the respective one of the at least one resonator rib; and
at least one transformer-coupling line, each of the at least one transformer-coupling line being conductively coupled to an associated circuit and being inductively coupled to the at least one resonator rib to inductively generate a clock current corresponding to the clock signal to provide functions for the associated circuit.

13. The system of claim 12, wherein each of the at least one resonator rib comprises at least one bend to provide a plurality of parallel portions of each of the at least one resonator rib, each of the plurality of parallel portions comprising a first end and a second end, wherein the second end of the respective one of the plurality of parallel portions is conductively coupled to a first end of a next one of the plurality of parallel portions via one of the respective at least one bend, wherein the thickness of at least one of the plurality of parallel portions of the respective at least one resonator rib varies in a tapered manner along a length of the respective one of the parallel portions.

14. The system of claim 13, wherein the thickness of the at least one of the plurality of parallel portions of the respective at least one resonator rib decreases in a tapered manner from a maximum thickness between the first end and the second end to each of a first minimum thickness at the first end and the second minimum thickness at the second end.

15. The system of claim 14, wherein the maximum thickness is located approximately half a length between the first end and the second end of the respective one of the plurality of parallel portions.

16. The system of claim 12, wherein each of the at least one resonator rib is configured as a linear extension between a first end proximal to the at least one resonator spine and a second end coupled to a low-voltage rail, wherein the at least one of the at least one resonator rib has a thickness that increases in the step-wise manner from the first end to the second end.

17. A clock distribution system comprising:
at least one resonator spine that propagates a clock signal;
at least one resonator rib conductively coupled to the at least one resonator spine and being arranged as a standing wave resonator, at least one of the at least one resonator rib having a thickness that varies in a step-wise manner along a length of the respective one of the at least one resonator rib; and
at least one transformer-coupling line, each of the at least one transformer-coupling line being conductively coupled to an associated circuit and being inductively coupled to the at least one resonator rib to inductively generate a clock current corresponding to the clock signal to provide functions for the associated circuit.

18. The system of claim 17, wherein each of the at least one resonator rib comprises at least one bend to provide a plurality of parallel portions of each of the at least one resonator rib, each of the plurality of parallel portions comprising a first end and a second end, wherein the second end of the respective one of the plurality of parallel portions is conductively coupled to a first end of a next one of the plurality of parallel portions via one of the respective at least one bend, wherein the thickness of at least one of the plurality of parallel portions of the respective at least one resonator rib varies in the step-wise manner along a length of the respective one of the parallel portions.

19. The system of claim 18, wherein the thickness of the at least one of the plurality of parallel portions of the respective at least one resonator rib increases in the step-wise manner from a first minimum thickness at the first end and from a second minimum thickness at the second end to a maximum thickness between the first end and the second end.

20. The system of claim 17, wherein each of the at least one resonator rib is configured as a linear extension between a first end proximal to the at least one resonator spine and a second end coupled to a low-voltage rail, wherein the at least one of the at least one has a thickness that increases in the step-wise manner from the first end to the second end.

* * * * *